US012633884B2

(12) United States Patent
Shimamoto

(10) Patent No.: US 12,633,884 B2
(45) Date of Patent: May 19, 2026

(54) POWER AMPLIFIER CIRCUIT

(71) Applicant: Murata Manufacturing Co., Ltd., Kyoto (JP)

(72) Inventor: Kenichi Shimamoto, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 521 days.

(21) Appl. No.: 18/192,213

(22) Filed: Mar. 29, 2023

(65) Prior Publication Data

US 2023/0318544 A1 Oct. 5, 2023

(30) Foreign Application Priority Data

Mar. 30, 2022 (JP) ................................. 2022-055280

(51) Int. Cl.
H03F 3/21 (2006.01)
H03F 1/56 (2006.01)

(52) U.S. Cl.
CPC ............. H03F 3/211 (2013.01); H03F 1/565 (2013.01); H03F 2200/222 (2013.01); H03F 2200/387 (2013.01); H03F 2200/546 (2013.01); H03F 2200/78 (2013.01)

(58) Field of Classification Search
CPC ............. H01L 23/66; H01L 2223/6611; H01L 2223/6655; H03F 1/0288; H03F 3/213; H03F 2200/451
USPC ........................................................ 330/1 A
See application file for complete search history.

(56) References Cited

U.S. PATENT DOCUMENTS 10,411,662 B2 9/2019 Lyalin et al.
11,290,064 B2 * 3/2022 Mu ...................... H03F 3/45179

FOREIGN PATENT DOCUMENTS

JP 2013012985 A * 1/2013

OTHER PUBLICATIONS

Kulkarni et al., "A Broadband 470-862 MHz Direct Conversion CMOS Receiver", Conference Paper • May 2010 (Year: 2010).*
Assim Boukhayma, "Ultra Low Noise CMOS Image Sensors", Doctoral Thesis accepted by École Polytechnique Fédérale de Lausanne, Switzerland, Jan. 2018 (Year: 2018).*

* cited by examiner

*Primary Examiner* — Hafizur Rahman
(74) *Attorney, Agent, or Firm* — McDonald Hopkins LLC

(57) ABSTRACT

A power amplifier circuit includes a first amplifier transistor having a base or gate for receiving a first signal inputted, the first signal being one balanced signal, a collector or drain for outputting a first amplified signal, and an emitter or source that is electrically connected to ground, a second amplifier transistor having a base or gate for receiving a second signal inputted, the second signal being another balanced signal, a collector or drain for outputting a second amplified signal, and an emitter or source that is electrically connected to the ground, a first variable capacitance electrically coupled between the collector or drain of the second amplifier transistor and the base or gate of the first amplifier transistor, and a second variable capacitance electrically coupled between the collector or drain of the first amplifier transistor and the base or gate of the second amplifier transistor.

17 Claims, 6 Drawing Sheets

FIG. 1

OUTPUT
PHASE(°)

POWER OF OUTPUT SIGNAL RFOUT (dBm)

POWER AMPLIFIER CIRCUIT

CROSS REFERENCE TO RELATED APPLICATION

This application claims priority from Japanese Patent Application No. 2022-055280 filed on Mar. 30, 2022. The content of this application is incorporated herein by reference in its entirety.

BACKGROUND ART

The present disclosure relates to a power amplifier circuit.

There are power amplification systems in which balanced signals amplified by a differential pair are transformed into a single-ended signal by a balun and outputted (see, for example, U.S. Pat. No. 10,411,662 (Patent Document 1)).

BRIEF SUMMARY

In the power amplification system described in Patent Document 1, when the output power of the power amplification system is increased, the phase of the output signals can be shifted forward. In such a case, the quality of output signals degrades. Thus, a need exists for technologies for suppressing degradation of output signals.

The present disclosure provides a power amplifier circuit that suppresses degradation in the quality of output signals.

A power amplifier circuit according to an aspect of the present disclosure includes a first amplifier transistor having a base or gate for receiving a first signal inputted, the first signal being one balanced signal, a collector or drain for outputting a first amplified signal generated by amplifying the first signal, and an emitter or source that is electrically connected to ground, a second amplifier transistor having a base or gate for receiving a second signal inputted, the second signal being another balanced signal, a collector or drain for outputting a second amplified signal generated by amplifying the second signal, and an emitter or source that is electrically connected to the ground, a first variable capacitance electrically coupled between the collector or drain of the second amplifier transistor and the base or gate of the first amplifier transistor, and a second variable capacitance electrically coupled between the collector or drain of the first amplifier transistor and the base or gate of the second amplifier transistor.

The present disclosure provides a power amplifier circuit that suppresses degradation in the quality of output signals.

BRIEF DESCRIPTION OF THE DRAWINGS

FIG. 1 is a circuit diagram of a power amplifier circuit 101;

DETAILED DESCRIPTION

Figure 2:
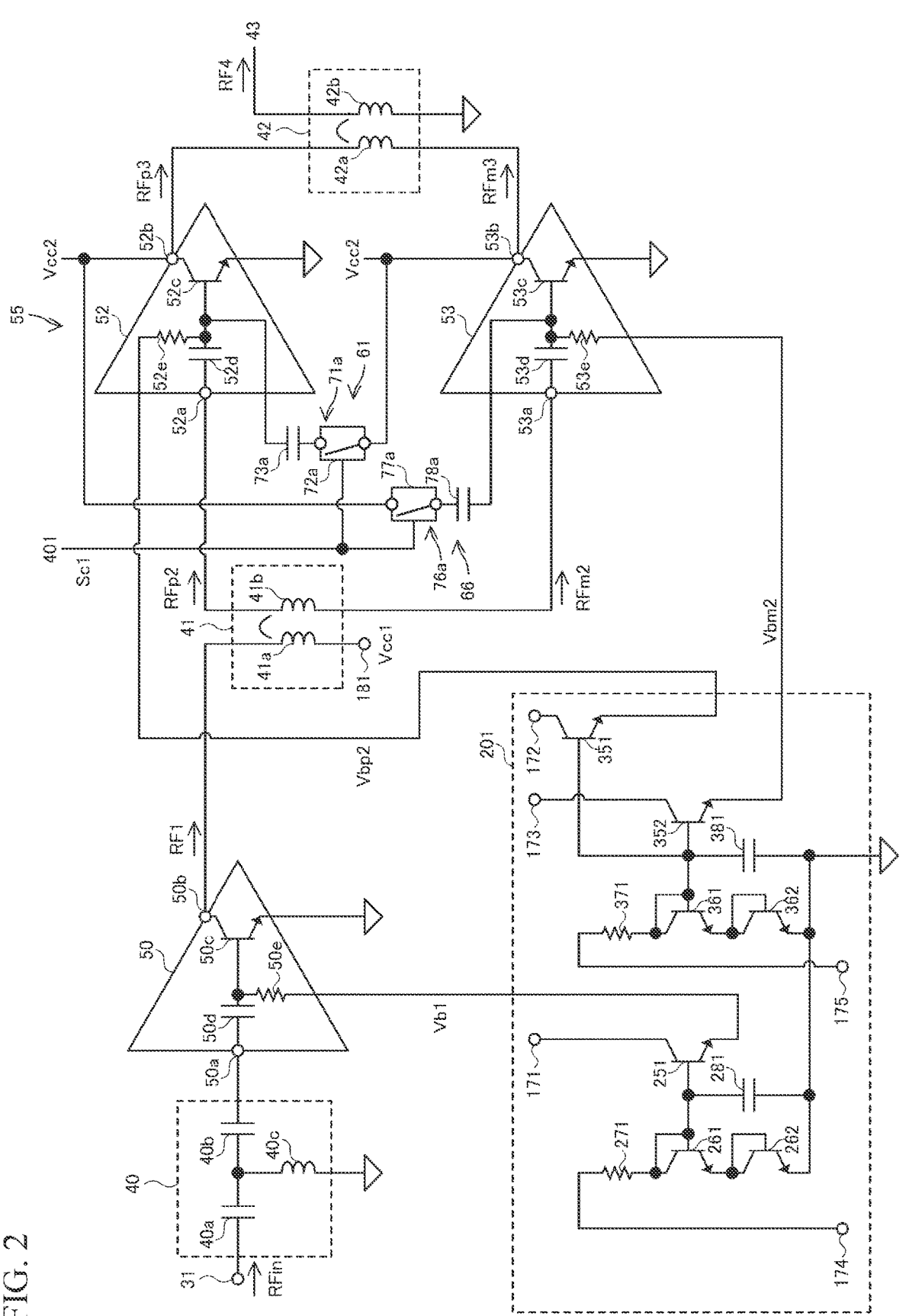
FIG. 2 is a detailed circuit diagram of matching circuits 40, 41, and 42, an amplifier 50, a differential pair 55, and a bias supply circuit 201.

Hereinafter, embodiments of the present disclosure will be described in detail with reference to the drawings. It should be noted that the same elements are assigned the same reference numerals, and redundant descriptions are omitted as much as possible.

First Embodiment

Figure 1:
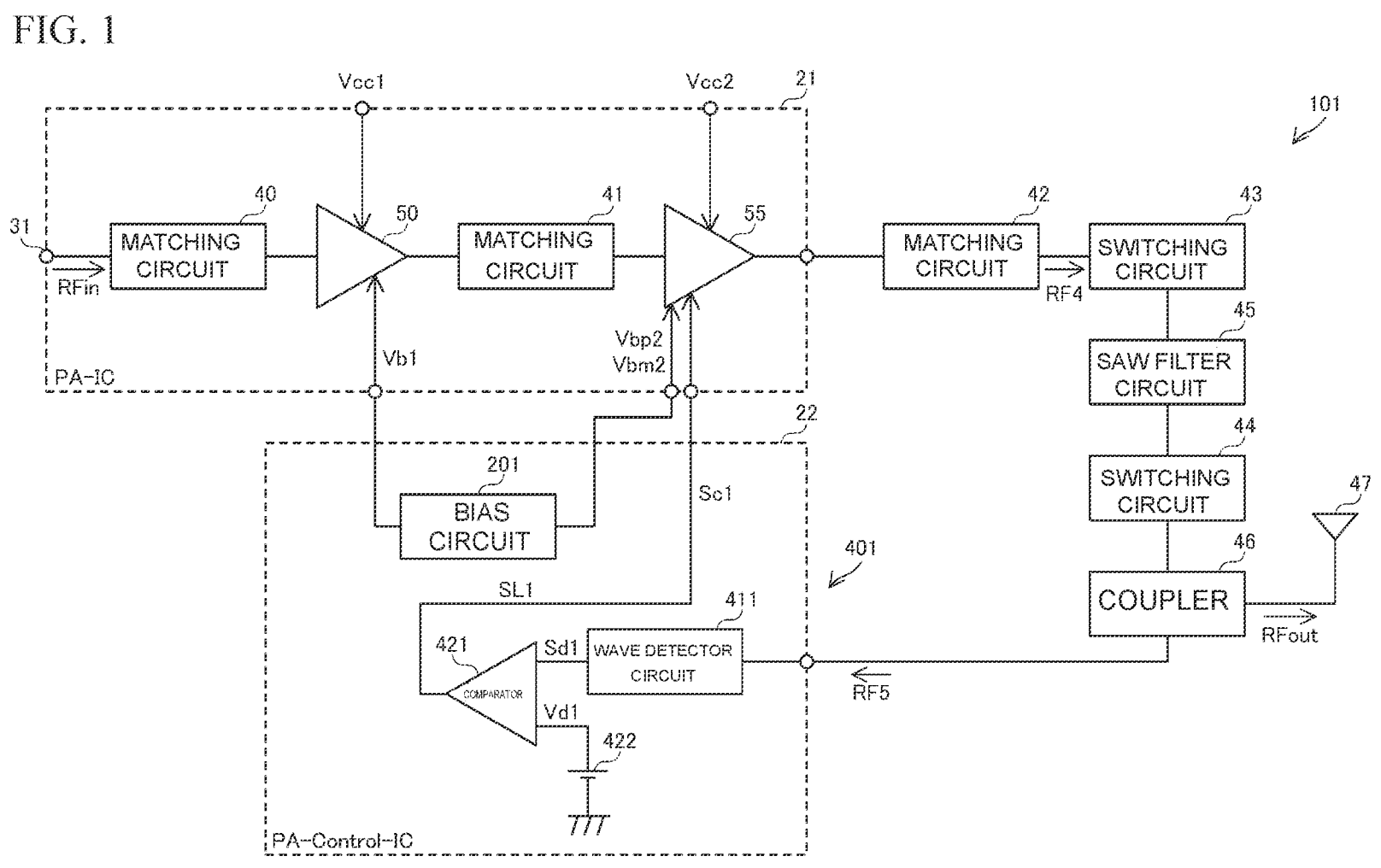

The following describes a power amplifier circuit 101 according to a first embodiment. FIG. 1 is a circuit diagram of the power amplifier circuit 101. As illustrated in FIG. 1, the power amplifier circuit 101 is a two-stage amplifier circuit configured to amplify an input signal RFin supplied to an input terminal 31 and output an output signal RFout to an antenna 47. The input signal RFin is, for example, a radio-frequency (RF) signal.

The power amplifier circuit 101 includes matching circuits 40, 41, and 42, switching circuits 43 and 44, a surface acoustic wave (SAW) filter circuit 45, a coupler 46, an amplifier 50, a differential pair 55, a bias supply circuit 201, and a control circuit 401 (a first control circuit).

In the present embodiment, the matching circuits 40 and 41, the amplifier 50, and the differential pair 55 are formed in a power amplifier integrated circuit 21. The bias supply circuit 201 and the control circuit 401 are formed in a power amplifier control integrated circuit 22.

FIG. 2 is a detailed circuit diagram of the matching circuits 40, 41, and 42, the amplifier 50, the differential pair 55, and the bias supply circuit 201. As illustrated in FIG. 2, the matching circuit 40 provides impedance matching between a circuit provided in the stage before the input terminal 31 and the amplifier 50.

In the present embodiment, the matching circuit 40 includes capacitors 40a and 40b and an inductor 40c. The capacitor 40a has a first end coupled to the input terminal 31 and a second end. The capacitor 40b has a first end coupled to the second end of the capacitor 40a and a second end. The inductor 40c has a first end coupled to the second end of the capacitor 40a and a second end that is grounded.

The amplifier 50 amplifies the input signal RFin supplied from the input terminal 31 via the matching circuit 40 to an input terminal 50a and outputs an amplified signal RF1 from an output terminal 50b. In the present embodiment, the amplifier 50 includes the input terminal 50a, the output terminal 50b, an amplifier transistor 50c (a third amplifier transistor), a capacitor 50d, and a resistance element 50e.

In the present embodiment, transistors including the amplifier transistor are implemented by, for example, bipolar transistors such as heterojunction bipolar transistors (HBTs). The transistors may be implemented by other kinds of transistors such as field-effect transistors (MOSFET: Metal-oxide-semiconductor Field-Effect Transistor). In this case, base, collector, and emitter are respectively regarded as gate, drain, and source.

The amplifier transistor 50c has the collector coupled to the output terminal 50b, the base coupled to the input terminal 50a via the capacitor 50d and also coupled to the bias supply circuit 201 via the resistance element 50e, and the emitter that is grounded.

The matching circuit 41 provides impedance matching between the amplifier 50 and the differential pair 55. The matching circuit 41 is also a balun configured to transform the amplified signal RF1, which is a single-ended signal, into an amplified signal RFp2 (a first signal) and an amplified signal RFm2 (a second signal), which are balanced signals.

In the present embodiment, the matching circuit 41 includes inductors 41*a* and 41*b*. The inductor 41*a* has a first end coupled to the output terminal 50*b* of the amplifier 50 and a second end coupled to a supply-voltage feeding terminal 181 for feeding a supply voltage Vcc1 to drive the amplifier transistor 50*c*. The inductor 41*b* has a first end for outputting the amplified signal RFp2 and a second end for outputting the amplified signal RFm2. The inductor 41*b* is coupleable with the inductor 41*a* via an electromagnetic field.

The differential pair 55 includes amplifiers 52 and 53, and a variable capacitance 61 (a first variable capacitance) and a variable capacitance 66 (a second variable capacitance). The amplifiers 52 and 53 respectively amplify the amplified signals RFp2 and RFm2 supplied from the matching circuit 41.

In the present embodiment, the amplifier 52 includes an input terminal 52*a*, an output terminal 52*b*, an amplifier transistor 52*c* (a first amplifier transistor), a capacitor 52*d*, and a resistance element 52*e*. The amplifier 53 includes an input terminal 53*a*, an output terminal 53*b*, an amplifier transistor 53*c* (a second amplifier transistor), a capacitor 53*d*, and a resistance element 53*e*.

The capacitor 52*d* of the amplifier 52 has a first end coupled to the first end of the inductor 41*b* via the input terminal 52*a* and a second end. A supply voltage Vcc2 for the amplifier transistor 52*c* is supplied to the output terminal 52*b* via, for example, an inductor (not illustrated in the drawing). For example, when envelope tracking control is performed in the power amplifier circuit 101, the supply voltage Vcc2 changes.

The amplifier transistor 52*c* has the collector coupled to the output terminal 52*b*, the base coupled to the second end of the capacitor 52*d* and also coupled to the bias supply circuit 201 via the resistance element 52*e*, and the emitter that is electrically grounded. The amplified signal RFp2, which is one of the balanced signals, is inputted to the base of the amplifier transistor 52*c*. An amplified signal RFp3 (a first amplified signal) generated by amplifying the amplified signal RFp2 is outputted from the collector of the amplifier transistor 52*c*.

The capacitor 53*d* of the amplifier 53 has a first end coupled to the second end of the inductor 41*b* via the input terminal 53*a* and a second end. A supply voltage Vcc2 for the amplifier transistor 53*c* is supplied to the output terminal 53*b* via, for example, an inductor (not illustrated in the drawing).

The amplifier transistor 53*c* has the collector coupled to the output terminal 53*b*, the base coupled to the second end of the capacitor 53*d* and also coupled to the bias supply circuit 201 via the resistance element 53*e*, and the emitter that is electrically grounded. The amplified signal RFm2, which is the other of the balanced signals, is inputted to the base of the amplifier transistor 53*c*. An amplified signal RFm3 (a second amplified signal) generated by amplifying the amplified signal RFm2 is outputted from the collector of the amplifier transistor 53*c*.

The matching circuit 42 provides impedance matching between the differential pair 55 and the switching circuit 43. The matching circuit 42 is a balun configured to transform the amplified signals RFp3 and RFm3, which are balanced signals, into an amplified signal RF4, which is a single-ended signal.

In the present embodiment, the matching circuit 42 includes inductors 42*a* and 42*b*. The inductor 42*a* has a first end coupled to the output terminal 52*b* of the amplifier 52 and a second end coupled to the output terminal 53*b* of the amplifier 53. The inductor 42*b* has a first end for outputting the amplified signal RF4 and a second end that is grounded. The inductor 42*b* is coupleable with the inductor 42*a* via an electromagnetic field.

The bias supply circuit 201 includes a bias transistor 251, transistors 261 and 262, a resistance element 271, a capacitor 281, bias transistors 351 and 352, transistors 361 and 362, a resistance element 371, and a capacitor 381.

The bias transistor 251 of the bias supply circuit 201 supplies a bias voltage Vb1 to the base of the amplifier transistor 50*c* through the resistance element 50*e*.

Specifically, the bias transistor 251 has the collector coupled to a battery-voltage feeding terminal 171, the base coupled to a current feeding terminal 174 via the resistance element 271, configured to receive bias current, and the emitter coupled to the base of the amplifier transistor 50*c* via the resistance element 50*e*. Bias voltage may be supplied to the base of the bias transistor 251.

The transistor 262 has the collector, the base coupled to the collector, and the emitter that is grounded. In the following description, the coupling of the collector and base of a transistor are sometimes referred to as diode coupling.

The transistor 261, which is diode-coupled, has the collector and base coupled to the base of the bias transistor 251 and the emitter coupled to the collector and base of the transistor 262.

The capacitor 281 has a first end coupled to the base of the bias transistor 251 and a second end that is grounded.

The bias transistor 351 supplies a bias voltage Vbp2 to the base of the amplifier transistor 52*c* through the resistance element 52*e*. The bias transistor 352 supplies a bias voltage Vbm2 to the base of the amplifier transistor 53*c* through the resistance element 53*e*.

Specifically, the bias transistor 351 has the collector coupled to a battery-voltage feeding terminal 172, the base coupled to a current feeding terminal 175 via the resistance element 371, configured to receive bias current, and the emitter coupled to the base of the amplifier transistor 52*c* via the resistance element 52*e*. Bias voltage may be supplied to the base of the bias transistor 351.

The bias transistor 352 has the collector coupled to a battery-voltage feeding terminal 173, the base coupled to the base of the bias transistor 351, configured to receive bias current, and the emitter coupled to the base of the amplifier transistor 53*c* via the resistance element 53*e*. Bias voltage may be supplied to the base of the bias transistor 352.

The transistor 362, which is diode-coupled, has the collector and base, and the emitter that is grounded.

The transistor 361, which is diode-coupled, has the collector and base coupled to the base of the bias transistor 351 and the base of the bias transistor 352, and the emitter coupled to the collector and base of the transistor 362.

The capacitor 381 has a first end coupled to the base of the bias transistor 351 and the base of the bias transistor 352 and a second end that is grounded.

As illustrated in FIG. 1, the SAW filter circuit 45 includes, for example, a plurality of SAW filters of different frequency bands. The switching circuits 43 and 44 change the path of the amplified signal RF4 supplied from the matching circuit 42 such that the amplified signal RF4 passes through one of the SAW filters.

The coupler 46 outputs to the control circuit 401 a portion of the electric power of the amplified signal RF4 supplied from the switching circuit 44 as an amplified signal RF5 (a third signal) and outputs the remainder of the electric power of the amplified signal RF4 to the antenna 47.

The control circuit 401 controls the variable capacitances 61 and 66 of the differential pair 55 based on whether the magnitude of the amplified signal RF5 generated from the amplified signals RFp3 and RFm3 is higher or lower than a direct-current voltage Vd1 (a first predetermined value).

In the present embodiment, the control circuit 401 includes a wave detector circuit 411, a comparator 421 (a first comparator circuit), and a direct-current (DC) power supply 422.

The wave detector circuit 411 generates a direct-current voltage signal Sd1 (a first voltage) based on the amplitude of the amplified signal RF5. In the present embodiment, the wave detector circuit 411 includes, for example, a diode and a capacitor. The wave detector circuit 411 rectifies the amplified signal RF5 supplied from the coupler 46 using the diode. The wave detector circuit 411 then generates the direct-current voltage signal Sd1 by smoothing, using the capacitor, the voltage of the amplified signal RF5 rectified and outputs the direct-current voltage signal Sd1 to the comparator 421.

The DC power supply 422 has a negative terminal that is grounded and a positive terminal for supplying a direct-current voltage Vd1 relative to the ground.

The comparator 421 outputs to the variable capacitances 61 and 66 a comparison result signal SL1 (a fourth signal) of a level determined based on the result of comparing the direct-current voltage signal Sd1 with the direct-current voltage Vd1. In the present embodiment, the comparator 421 has a first input terminal for receiving the direct-current voltage signal Sd1 supplied from the wave detector circuit 411, a second input terminal for receiving the direct-current voltage Vd1 supplied from the positive terminal of the DC power supply 422, and an output terminal.

For example, when the direct-current voltage signal Sd1 is higher than or equal to the direct-current voltage Vd1, the comparator 421 outputs from the output terminal the comparison result signal SL1 of high level as a cross coupling capacitor (CCC) control signal Sc1 to the differential pair 55. By contrast, for example, when the direct-current voltage signal Sd1 is lower than the direct-current voltage Vd1, the comparator 421 outputs from the output terminal the comparison result signal SL1 of low level as the CCC control signal Sc1 to the differential pair 55.

As illustrated in FIG. 2, the variable capacitances 61 and 66 of the differential pair 55 have a function of changing the phase of the amplifier transistors 52c and 53c. In the present embodiment, the variable capacitances 61 and 66 respectively include variable capacitance circuits 71a and 76c. The variable capacitance circuit 71a includes a switch 72a (a first switch) and a capacitor 73a (a first capacitor). The variable capacitance circuit 76a includes a switch 77a (a second switch) and a capacitor 78a (a second capacitor).

The variable capacitance circuit 71a is electrically coupled between the collector of the amplifier transistor 53c and the base of the amplifier transistor 52c. The switch 72a and the capacitor 73a of the variable capacitance circuit 71a are coupled in series with each other.

In the present embodiment, the switch 72a has a first end coupled to the collector of the amplifier transistor 53c via the output terminal 53b and a second end.

The capacitor 73a has a first end coupled to the second end of the switch 72a and a second end coupled to the base of the amplifier transistor 52c.

The variable capacitance circuit 76a is electrically coupled between the collector of the amplifier transistor 52c and the base of the amplifier transistor 53c. The switch 77a and the capacitor 78a of the variable capacitance circuit 76a are coupled in series with each other.

In the present embodiment, the switch 77a has a first end coupled to the collector of the amplifier transistor 52c via the output terminal 52b and a second end.

The capacitor 78a has a first end coupled to the second end of the switch 77a and a second end coupled to the base of the amplifier transistor 53c.

For example, when the CCC control signal Sc1 of high level is supplied, the switches 72a and 77a are closed; when the CCC control signal Sc1 of low level is supplied, the switches 72a and 77a are open.

When the switches 72a and 77a are closed, the capacitors 73a and 78a operate as cross coupling capacitors and delay the phase of an output signal (hereinafter sometimes referred to as the output phase) relative to the phase of the input signal at the amplifier transistors 52c and 53c. By contrast, when the switches 72a and 77a are open, the capacitors 73a and 78a do not operate as cross coupling capacitors, and thus, the amplifier transistors 52c and 53c operate as a normal differential amplifier. In other words, the variable capacitance circuits 71a and 76a are circuits for coupling a capacitance of a given value (the value can be zero in particular cases) to the amplifier transistors 52c and 53c based on the CCC control signal Sc1.

Effects

Figure 3:
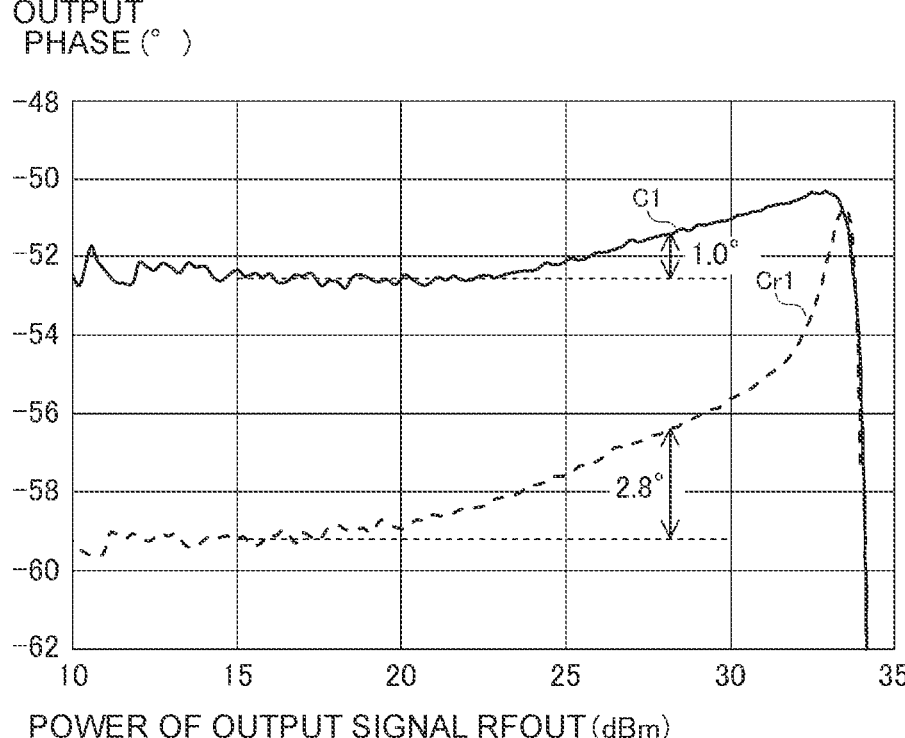
FIG. 3 illustrates an example of changes in the output phase of amplifier transistors 52c and 53c versus the power of an output signal RFout.

FIG. 3 illustrates an example of changes in the output phase of the amplifier transistors 52c and 53c versus the power of the output signal RFout. In FIG. 3, the horizontal axis indicates the power of the output signal RFout in units of dBm; the vertical axis indicates the output phase in units of degrees (°).

As illustrated in FIG. 3, a curved line Cr1 is a plot of changes in the output phase when cross coupling capacitors are not provided in the differential pair 55. From about the point at which the power of the output signal RFout exceeds 15 dBm, the advancement of the output phase starts. The output phase at 28 dBm is advanced by about 2.8° as compared to the output phase at 15 dBm.

Figure 4:
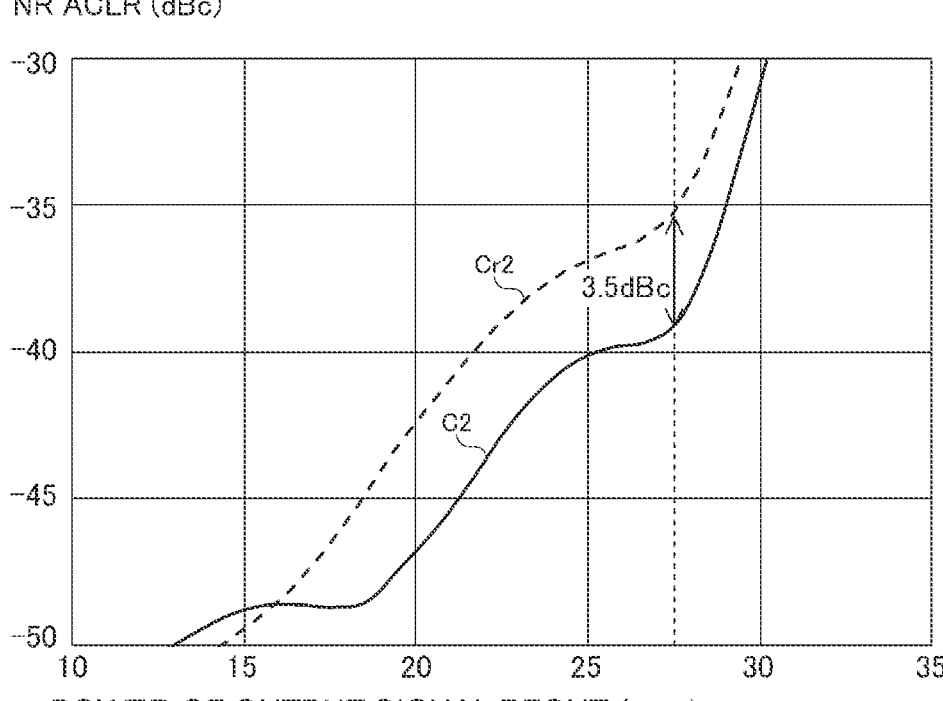
FIG. 4 illustrates an example of changes in the new radio adjacent channel leakage ratio (NR ACLR) versus the power of the output signal RFout.

FIG. 4 illustrates an example of changes in the new radio adjacent channel leakage ratio (NR ACLR) versus the power of the output signal RFout. In FIG. 4, the horizontal axis indicates the power of the output signal RFout in units of dBm; the vertical axis indicates NR ACLR in units of dBc.

As illustrated in FIG. 4, a curved line Cr2 is a plot of changes in NR ACLR when cross coupling capacitors are not provided in the differential pair 55. When the output phase is advanced, signal distortion is increased. And thus, this example is undesirable because NR ACLR increases from 15 dBm at which the advancement of the output phase starts.

By contrast, a curved line C1 (see FIG. 3) is a plot of changes in the output phase when the switches 72a and 77a of the differential pair 55 are closed, in other words, changes in the output phase when cross coupling capacitors are provided in the differential pair 55. Although the advancement of the output phase starts from about the point at which the power of the output signal RFout exceeds 15 dBm, the degree of advancement of the output phase is suppressed as compared to the curved line Cr1. For example, the output phase at 28 dBm is advanced by about 1.0° as compared to the output phase at 15 dBm.

A curved line C2 (see FIG. 4) is a plot of changes in NR ACLR when cross coupling capacitors are provided in the differential pair 55. As compared to the curved line Cr2, NR ACLR is decreased. For example, as compared to the curved line Cr2, NR ACLR at 27.5 dBm is decreased by about 3.5 dBc.

For example, if cross coupling capacitors are simply provided in the differential pair 55, the output phase is always changed irrespective of the power of the output signal RFout. This example is thus undesirable.

In the present embodiment, when signal distortion due to the advancement of the output phase is relatively small, for example when the power of the output signal RFout is lower than 15 dBm, the switches 72a and 77a are driven into the open state so that the amplifier transistors 52c and 53c are made to operate as a normal differential amplifier.

When signal distortion due to the advancement of the output phase is relatively large, for example, when the power of the output signal RFout is higher than or equal to 15 dBm, the switches 72a and 77a are driven into the closed state so that the capacitors 73a and 78a are made to operate as cross coupling capacitors. As a result, the output phase is controllable in only the high-power region in which signal distortion due to the output phase is relatively large.

Second Embodiment

The following describes a power amplifier circuit 102 according to a second embodiment. In the second embodiment, descriptions of the specifics common to the first embodiment are not repeated, and only different points will be explained. In particular, the same effects and advantages achieved by the same configurations are not mentioned in every embodiment.

Figure 5:
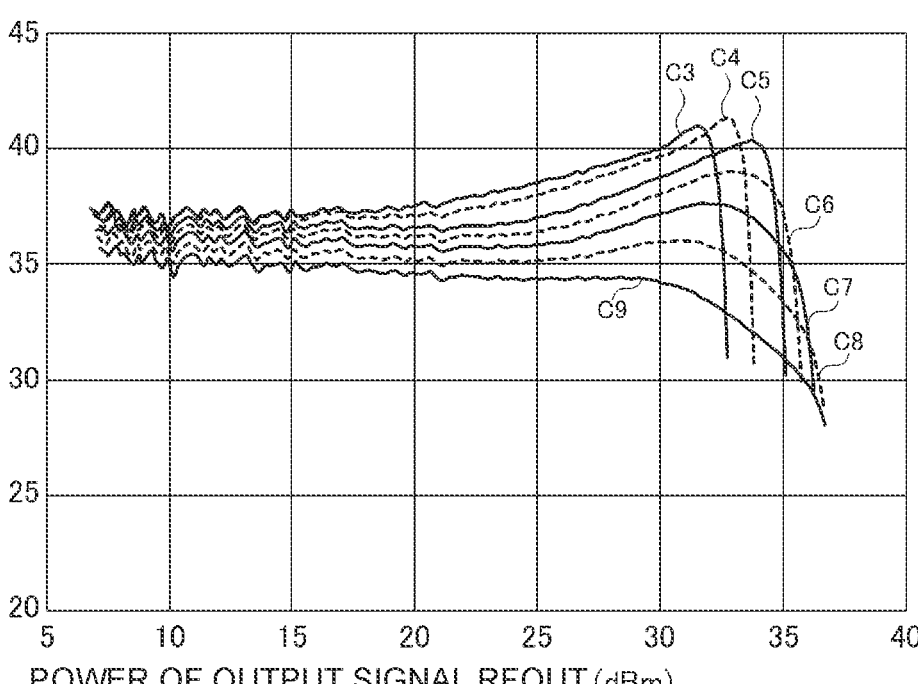
FIG. 5 illustrates an example of changes in the output phase of the amplifier transistors 52c and 53c versus the power of the output signal RFout, with respect to a supply voltage Vcc2 of different levels.

FIG. 5 illustrates an example of changes in the output phase of the amplifier transistors 52c and 53c versus the power of the output signal RFout, with respect to the supply voltage Vcc2 of different levels. In FIG. 5, the horizontal axis indicates the power of the output signal RFout in units of dBm; the vertical axis indicates the output phase in units of degrees (°).

Curved lines C3, C4, C5, C6, C7, C8, and C9 respectively indicate a plot of changes in phase with output power when the supply voltage Vcc2 is 3.0 V, 3.4 V, 4.0 V, 4.4 V, 4.8 V, 5.2 V, and 5.6V.

Changes in the output phase with the power of the output signal RFout significantly vary depending on the value of the supply voltage Vcc2. As a result, when the supply voltage Vcc2 is changed by envelope tracking control, controlling the output phase based on only the power of the output signal RFout can result in inadequate control on advancement of the output phase, and as a result, relatively large signal distortion can be effected. The power amplifier circuit 102 according to the second embodiment addresses this problem.

Figure 6:
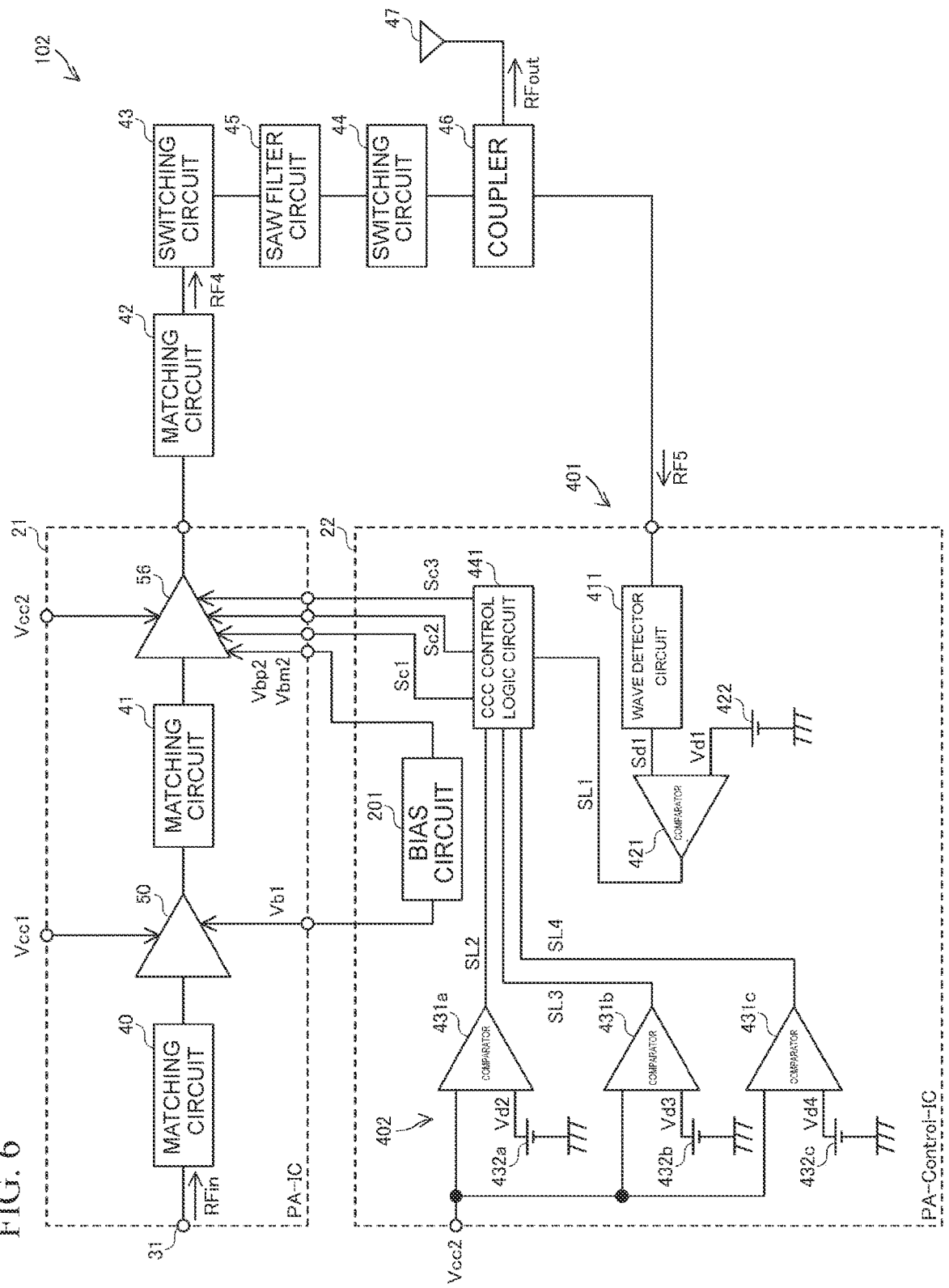
FIG. 6 is a circuit diagram of a power amplifier circuit 102.

FIG. 6 is a circuit diagram of the power amplifier circuit 102. As illustrated in FIG. 6, the power amplifier circuit 102 according to the second embodiment differs from the power amplifier circuit 101 according to the first embodiment in that the supply voltage to a differential pair is additionally used to control variable capacitances.

As compared to the power amplifier circuit 101 illustrated in FIG. 1, the power amplifier circuit 102 includes a differential pair 56 instead of the differential pair 55 and additionally includes a control circuit 402 (a second control circuit) and a CCC control logic circuit 441 (a third control circuit). The control circuit 402 and the CCC control logic circuit 441 are formed in the power amplifier control integrated circuit 22.

Figure 7:
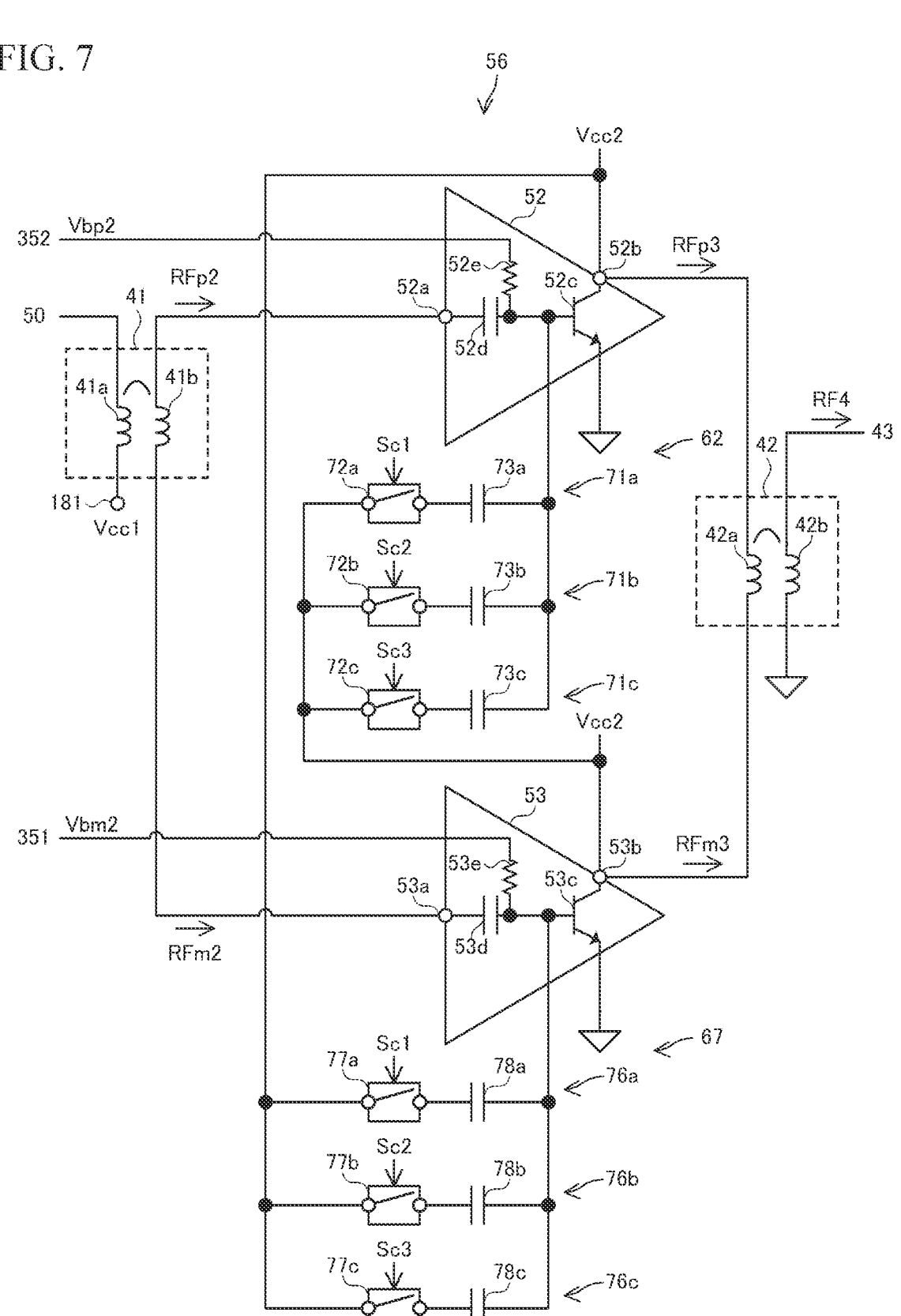
FIG. 7 is a detailed circuit diagram of matching circuits 41 and 42 and a differential pair 56.

FIG. 7 is a detailed circuit diagram of the matching circuits 41 and 42 and the differential pair 56. As illustrated in FIG. 7, as compared to the differential pair 55 illustrated in FIG. 2, the differential pair 56 includes a variable capacitance 62 (a first variable capacitance) and a variable capacitance 67 (a second variable capacitance) instead of the variable capacitances 61 and 66.

As compared to the variable capacitance 61 illustrated in FIG. 2, the variable capacitance 62 additionally includes variable capacitance circuits 71b and 71c. The variable capacitance circuit 71b includes a switch 72b (a third switch) and a capacitor 73b (a third capacitor). The variable capacitance circuit 71c includes a switch 72c and a capacitor 73c.

The switch 72b and the capacitor 73b are coupled in series with each other. The switch 72b and the capacitor 73b are coupled in parallel with the switch 72a and the capacitor 73a.

In the present embodiment, the switch 72b has a first end coupled to the collector of the amplifier transistor 53c via the output terminal 53b and a second end.

The capacitor 73b has a first end coupled to the second end of the switch 72b and a second end coupled to the base of the amplifier transistor 52c.

The switch 72c and the capacitor 73c are coupled in series with each other. The switch 72c and the capacitor 73c are coupled in parallel with the switch 72a and the capacitor 73a.

In the present embodiment, the switch 72c has a first end coupled to the collector of the amplifier transistor 53c via the output terminal 53b and a second end.

The capacitor 73c has a first end coupled to the second end of the switch 72c and a second end coupled to the base of the amplifier transistor 52c.

As compared to the variable capacitance 66 illustrated in FIG. 2, the variable capacitance 67 additionally includes variable capacitance circuits 76b and 76c. The variable capacitance circuit 76b includes a switch 77b (a fourth switch) and a capacitor 78b (a fourth capacitor). The variable capacitance circuit 76c includes a switch 77c and a capacitor 78c.

The switch 77b and the capacitor 78b are coupled in series with each other. The switch 77b and the capacitor 78b are coupled in parallel with the switch 77a and the capacitor 78a.

In the present embodiment, the switch 77b has a first end coupled to the collector of the amplifier transistor 52c via the output terminal 52b and a second end.

The capacitor 78b has a first end coupled to the second end of the switch 77b and a second end coupled to the base of the amplifier transistor 53c.

The switch 77c and the capacitor 78c are coupled in series with each other. The switch 77c and the capacitor 78c are coupled in parallel with the switch 77a and the capacitor 78a.

In the present embodiment, the switch 77c has a first end coupled to the collector of the amplifier transistor 52c via the output terminal 52b and a second end.

The capacitor 78c has a first end coupled to the second end of the switch 77c and a second end coupled to the base of the amplifier transistor 53c.

For example, when a CCC control signal Sc2 of high level is supplied, the switches 72b and 77b are closed; when the CCC control signal Sc2 of low level is supplied, the switches 72b and 77b are open.

For example, when a CCC control signal Sc3 of high level is supplied, the switches 72c and 77c are closed; when the CCC control signal Sc3 of low level is supplied, the switches 72c and 77c are open.

As illustrated in FIG. 6, the control circuit 402 controls the variable capacitances 62 and 67 based on the amount of the supply voltage Vcc2 supplied to the amplifier transistors 52c and 53c of the differential pair 56.

In the present embodiment, the control circuit 402 includes a comparator 431a (a second comparator circuit), a comparator 431b (a third comparator circuit), and a comparator 431c, and DC power supplies 432a, 432b, and 432c.

The DC power supply 432a has a negative terminal that is grounded and a positive terminal for supplying a direct-current voltage Vd2 (a second predetermined value) relative to the ground.

The comparator 431a outputs to the variable capacitances 62 and 67 a comparison result signal SL2 (a fifth signal) of a level determined based on the result of comparing the supply voltage Vcc2 with the direct-current voltage Vd2. In the present embodiment, the comparator 431a has a first input terminal for receiving the supply voltage Vcc2 supplied, a second input terminal for receiving the direct-current voltage Vd2 supplied from the positive terminal of the DC power supply 432a, and an output terminal.

The comparator 431a outputs from the output terminal the comparison result signal SL2 of high level to the CCC control logic circuit 441, for example, when the supply voltage Vcc2 is higher than or equal to the direct-current voltage Vd2. By contrast, the comparator 431a outputs from the output terminal the comparison result signal SL2 of low level to the CCC control logic circuit 441, for example, when the supply voltage Vcc2 is lower than the direct-current voltage Vd2.

The DC power supply 432b has a negative terminal that is grounded and a positive terminal for supplying a direct-current voltage Vd3 (a third predetermined value) that differs from the direct-current voltage Vd2, for example, such that the direct-current voltage Vd3 is higher than the direct-current voltage Vd2.

The comparator 431b outputs to the variable capacitances 62 and 67 a comparison result signal SL3 (a sixth signal) of a level determined based on the result of comparing the supply voltage Vcc2 with the direct-current voltage Vd3. In the present embodiment, the comparator 431b has a first input terminal for receiving the supply voltage Vcc2 supplied, a second input terminal for receiving the direct-current voltage Vd3 supplied from the positive terminal of the DC power supply 432b, and an output terminal.

The comparator 431b outputs from the output terminal the comparison result signal SL3 of high level to the CCC control logic circuit 441, for example, when the supply voltage Vcc2 is higher than or equal to the direct-current voltage Vd3. By contrast, the comparator 431b outputs from the output terminal the comparison result signal SL3 of low level to the CCC control logic circuit 441, for example, when the supply voltage Vcc2 is lower than the direct-current voltage Vd3.

The DC power supply 432c has a negative terminal that is grounded and a positive terminal for supplying a direct-current voltage Vd4 that differs from the direct-current voltages Vd2 and Vd3, for example, such that the direct-current voltage Vd4 is higher than the direct-current voltage Vd3.

The comparator 431c outputs to the variable capacitances 62 and 67 a comparison result signal SL4 of a level determined based on the result of comparing the supply voltage Vcc2 with the direct-current voltage Vd4. In the present embodiment, the comparator 431c has a first input terminal for receiving the supply voltage Vcc2 supplied, a second input terminal for receiving the direct-current voltage Vd4 supplied from the positive terminal of the DC power supply 432c, and an output terminal.

The comparator 431c outputs from the output terminal the comparison result signal SL4 of high level to the CCC control logic circuit 441, for example, when the supply voltage Vcc2 is higher than or equal to the direct-current voltage Vd4. By contrast, the comparator 431c outputs from the output terminal the comparison result signal SL4 of low level to the CCC control logic circuit 441, for example, when the supply voltage Vcc2 is lower than the direct-current voltage Vd4.

The CCC control logic circuit 441 controls the variable capacitances 62 and 67 based on the comparison result signals SL1, SL2, SL3, and SL4 respectively supplied from the comparators 421, 431a, 431b, and 431c.

The CCC control logic circuit 441 determines the level of each of the CCC control signals Sc1, Sc2, and Sc3 based on the level of each of the comparison result signals SL1, SL2, SL3, and SL4.

The CCC control logic circuit 441 outputs the CCC control signal Sc1 of the determined level to the switches 72a and 77a. Similarly, the CCC control logic circuit 441 outputs the CCC control signal Sc2 of the determined level to the switches 72b and 77b. Similarly, the CCC control logic circuit 441 outputs the CCC control signal Sc3 of the determined level to the switches 72c and 77c.

With this configuration in which the variable capacitances 62 and 67 are controlled based on the amplified signal RF5 and the supply voltage Vcc2, it is possible to suppress the advancement of the output phase with the increase in the power of the output signal RFout and also suppress the advancement of the output phase that varies depending on the level of the supply voltage Vcc2. As such, when the supply voltage Vcc2 is changed by envelope tracking control, the advancement of the output phase is suppressed, and accordingly, increases in NR ACLR due to signal distortion are reduced.

In the above description, the control circuit 402 outputs three kinds of comparison result signals, specifically the comparison result signals SL2, SL3, and SL4, but this is not to be interpreted as limiting. It may be possible that the control circuit 402 outputs one, two, or four or more kinds of comparison result signals.

In the above description, the power amplifier circuit 102 is provided with the control circuit 401, but this is not to be interpreted as limiting. It may be possible that the power amplifier circuit 102 is not provided with the control circuit 401.

In the above description, in the power amplifier circuits 101 and 102, a variable capacitance includes a capacitor and a switch coupled in series with each other, but this is not to be interpreted as limiting. It may be possible that a variable capacitance includes a varicap diode.

In the above description, in the power amplifier circuits 101 and 102, the switch in a variable capacitance is automatically controlled by a control circuit, but this is not to be interpreted as limiting. It may be possible that a signal manually changeable with respect to level is supplied to the switch in a variable capacitance.

The exemplary embodiments of the present disclosure have been described above. In the power amplifier circuits 101 and 102, the amplifier transistor 52c has a base for receiving the amplified signal RFp2 inputted, the amplified signal RFp2 being one balanced signal, a collector for outputting the amplified signal RFp3 generated by amplifying the amplified signal RFp2, and an emitter that is electrically connected to the ground. The amplifier transistor 53c has a base for receiving the amplified signal RFm2 inputted, the amplified signal RFm2 being another balanced signal, a collector for outputting the amplified signal RFm3 generated by amplifying the amplified signal RFm2, and an emitter that is electrically connected to the ground. The variable capacitance 61 and 62 are electrically coupled between the collector of the amplifier transistor 53c and the base of the amplifier transistor 52c. The variable capacitance 66 and 67 are electrically coupled between the collector of the amplifier transistor 52c and the base of the amplifier transistor 53c.

With this configuration, the capacitance of each of the variable capacitances 61 and 66 or the capacitance of each of the variable capacitances 62 and 67 are changed, and as a result, the output phase of the amplifier transistor 52c and the output phase of the amplifier transistor 53c are changed. When the power of the amplified signals RFp3 and RFm3 is increased, the capacitance of each of the variable capacitances 61 and 66 or the capacitance of each of the variable capacitances 62 and 67 are controlled as appropriate. As a result, the advancement of the output phase is suppressed, and increases in distortion of the amplified signals RFp3 and RFm3 are suppressed. As such, a power amplifier circuit that suppresses degradation in the quality of output signals is provided.

In the power amplifier circuits 101 and 102, the variable capacitances 61 and 62 include the capacitor 73a and the switch 72a that are coupled in series with each other. The variable capacitances 66 and 67 include the capacitor 78a and the switch 77a that are coupled in series with each other.

With this configuration, by opening or closing each of the switches 72a and 77a, it is possible to easily change between the state in which cross coupling capacitors are coupled between the amplifier transistors 52c and 53c and the state in which the CCCs are disconnected. As a result, when the power of the amplified signals RFp3 and RFm3 is increased, the CCCs are caused to be coupled between the amplifier transistors 52c and 53c. As such, it is possible to suppress the advancement of the output phase. When the power of the amplified signals RFp3 and RFm3 is decreased, the CCCs are caused to be disconnected. As such, it is possible to suppress degradation in the power of the amplified signals RFp3 and RFm3 due to the CCCs.

In the power amplifier circuit 102, the variable capacitance 62 further includes the capacitor 73b and the switch 72b that are coupled in series with each other and that are coupled in parallel with the capacitor 73a and the switch 72a. The variable capacitance 67 further includes the capacitor 78b and the switch 77b that are coupled in series with each other and that are coupled in parallel with the capacitor 78a and the switch 77a.

With this configuration, by opening or closing each of the switches 72b and 77b, it is possible to easily change between the state in which the capacitance of the CCCs is relatively large and the state in which the capacitance of the CCCs is relatively small. As a result, it is possible to provide fine adjustment with respect to the output phase, thereby effectively suppressing the advancement of the output phase.

In the power amplifier circuits 101 and 102, the control circuit 401 controls the variable capacitances 61 and 66 or the variable capacitances 62 and 67 based on whether the magnitude of the amplified signal RF5 generated from the amplified signals RFp3 and RFm3 is higher or lower than a direct-current voltage Vd1.

With this configuration, it is possible to implement a circuit in which the capacitance of each of the variable capacitances 61 and 66 or the capacitance of each of the variable capacitances 62 and 67 is automatically changeable using the power of the amplified signals RFp3 and RFm3 corresponding to the amount of the direct-current voltage Vd1.

In the power amplifier circuits 101 and 102, the wave detector circuit 411 generates the direct-current voltage signal Sd1 based on the amplitude of the amplified signal RF5. The comparator 421 outputs to the variable capacitances 61 and 66 or the variable capacitances 62 and 67 the comparison result signal SL1 of a level determined based on the result of comparing the direct-current voltage signal Sd1 with the direct-current voltage Vd1.

With this configuration, it is possible to implement a circuit in which the capacitance of each of the variable capacitances 61 and 66 or the capacitance of each of the variable capacitances 62 and 67 is automatically changeable based on the result of comparing the direct-current voltage signal Sd1 with the direct-current voltage Vd1.

In the power amplifier circuit 102, the control circuit 402 controls the variable capacitances 62 and 67 based on the amount of the supply voltage Vcc2 supplied to the amplifier transistors 52c and 53c.

With this configuration, it is possible to implement a circuit in which the capacitance of each of the variable capacitances 62 and 67 is automatically changeable using the power of the amplified signals RFp3 and RFm3 corresponding to the amount of the supply voltage Vcc2. As a result, for example, when the supply voltage Vcc2 is changed by envelope tracking control, it is possible to effectively suppress the advancement of the output phase.

In the power amplifier circuit 102, the control circuit 402 includes the comparator 431a configured to output the comparison result signal SL2 of a level determined based on the result of comparing the supply voltage Vcc2 with the direct-current voltage Vd2 to the variable capacitances 62 and 67.

With this configuration, it is possible to implement a circuit in which the capacitance of each of the variable capacitances 62 and 67 is automatically changeable based on the result of comparing the supply voltage Vcc2 with the direct-current voltage Vd2.

In the power amplifier circuit 102, the control circuit 402 includes the comparator 431b configured to output to the variable capacitances 62 and 67 the CCC control signal Sc3 of a level determined based on the result of comparing the supply voltage Vcc2 with the direct-current voltage Vd3 that is different from the direct-current voltage Vd2.

With this configuration, it is possible to implement a circuit in which the capacitance of each of the variable capacitances 62 and 67 is automatically changeable based on which of the three voltage ranges divided by the supply voltage Vcc2 and the direct-current voltage Vd3 different from the direct-current voltage Vd2 the supply voltage Vcc2 belongs to. As a result, it is possible to provide fine adjustment with respect to the output phase, thereby effectively suppressing the advancement of the output phase.

In the power amplifier circuit 102, the CCC control logic circuit 441 controls the variable capacitances 62 and 67 based on the level of the comparison result signal SL1 and the level of the comparison result signal SL2.

With this configuration, it is possible to implement a circuit in which the capacitance of each of the variable capacitances 62 and 67 is automatically changeable based on the result of comparing the direct-current voltage signal Sd1 with the direct-current voltage Vd1 and the result of comparing the supply voltage Vcc2 with the direct-current voltage Vd2. As a result, it is possible to effectively suppress both of the advancement of the output phase due to changes in the supply voltage Vcc2 by, for example, envelope tracking control and the advancement of the output phase due to increases or decreases in the power of the amplified signals RFp3 and RFm3.

In the power amplifier circuits 101 and 102, the amplifier transistor 50*c* is provided in the stage before the amplifier transistors 52*c* and 53*c*.

With this configuration, it is possible to effectively suppress the advancement of the output phase of the amplifier transistors 52*c* and 53*c* that are in the power stage in which changes in the output phase are relatively large.

The embodiments described above have been made for ease of understanding the present disclosure and should not be interpreted as limiting. The present disclosure may be changed or improved without necessarily departing from its spirit, and the present disclosure also includes equivalents thereof. This means that modifications to the embodiments designed by those skilled in the art as appropriate are also embodied in the scope of the present disclosure when the modifications have features of the present disclosure. For example, the elements included in the embodiments, the arrangements thereof, materials, conditions, shapes, sizes are not limited to the examples and may be changed as appropriate. The embodiments described above are mere examples, and as might be expected, the configurations described in the different embodiments may be partially replaced or combined with each other. These modifications are embraced within the scope of the present disclosure when these modifications contain the attributes of the present disclosure.

What is claimed is:

1. A power amplifier circuit comprising:
a first amplifier transistor comprising a base or gate configured to receive a first signal inputted, the first signal comprising one balanced signal, a collector or drain configured to output a first amplified signal generated by amplifying the first signal, and an emitter or source that is electrically connected to ground;
a second amplifier transistor comprising a base or gate configured to receive a second signal inputted, the second signal comprising a second balanced signal, a collector or drain configured to output a second amplified signal generated by amplifying the second signal, and an emitter or source that is electrically connected to the ground;
a first variable capacitance electrically coupled between the collector or drain of the second amplifier transistor and the base or gate of the first amplifier transistor; and
a second variable capacitance electrically coupled between the collector or drain of the first amplifier transistor and the base or gate of the second amplifier transistor,
wherein the first variable capacitance comprises a first capacitor and a first switch that are coupled in series with each other, and wherein the second variable capacitance comprises a second capacitor and a second switch that are coupled in series with each other.

2. The power amplifier circuit according to claim 1, further comprising:
a second control circuit configured to control the first variable capacitance and the second variable capacitance based on an amount of a supply voltage supplied to the first amplifier transistor and the second amplifier transistor.

3. The power amplifier circuit according to claim 1, wherein
the first variable capacitance further comprises a third capacitor and a third switch that are coupled in series with each other and that are coupled in parallel with the first capacitor and the first switch, and
the second variable capacitance further comprises a fourth capacitor and a fourth switch that are coupled in series with each other and that are coupled in parallel with the second capacitor and the second switch.

4. The power amplifier circuit according to claim 1, further comprising:
a first control circuit configured to control the first variable capacitance and the second variable capacitance based on whether a third signal generated from the first amplified signal and the second amplified signal is greater or smaller than a first predetermined value.

5. The power amplifier circuit according to claim 4, wherein
the first control circuit comprises:
a wave detector circuit configured to generate a first voltage based on an amplitude of the third signal, and
a first comparator circuit configured to output a fourth signal of a level determined based on a result of comparing the first voltage with the first predetermined value to the first variable capacitance and the second variable capacitance.

6. The power amplifier circuit according to claim 2, wherein
the second control circuit comprises a second comparator circuit configured to output a fifth signal of a level determined based on a result of comparing the supply voltage with a second predetermined value to the first variable capacitance and the second variable capacitance.

7. The power amplifier circuit according to claim 6, wherein
the second control circuit further comprises a third comparator circuit configured to output a sixth signal of a level determined based on a result of comparing the supply voltage with a third predetermined value that is different from the second predetermined value to the first variable capacitance and the second variable capacitance.

8. The power amplifier circuit according to of claim 7, further comprising:
a third amplifier transistor in a stage before the first amplifier transistor and the second amplifier transistor.

9. The power amplifier circuit according to claim 5, further comprising:
a second comparator circuit configured to output a fifth signal of a level determined based on a result of comparing a supply voltage supplied to the first amplifier transistor and the second amplifier transistor with a second predetermined value; and a third control circuit configured to control the first variable capacitance and the second variable capacitance based on the level of the fourth signal and the level of the fifth signal.

10. The power amplifier circuit according to of claim 1, further comprising:

a third amplifier transistor in a stage before the first amplifier transistor and the second amplifier transistor.

11. The power amplifier circuit according to of claim 9, further comprising:

a third amplifier transistor in a stage before the first amplifier transistor and the second amplifier transistor.

12. The power amplifier circuit according to claim 3, further comprising:

a first control circuit configured to control the first variable capacitance and the second variable capacitance based on whether a third signal generated from the first amplified signal and the second amplified signal is greater or smaller than a first predetermined value.

13. The power amplifier circuit according to of claim 6, further comprising:

a third amplifier transistor in a stage before the first amplifier transistor and the second amplifier transistor.

14. The power amplifier circuit according to of claim 3, further comprising:

a third amplifier transistor in a stage before the first amplifier transistor and the second amplifier transistor.

15. The power amplifier circuit according to of claim 4, further comprising:

a third amplifier transistor in a stage before the first amplifier transistor and the second amplifier transistor.

16. The power amplifier circuit according to of claim 5, further comprising:

a third amplifier transistor in a stage before the first amplifier transistor and the second amplifier transistor.

17. The power amplifier circuit according to of claim 2, further comprising:

a third amplifier transistor in a stage before the first amplifier transistor and the second amplifier transistor.

* * * * *